(12) United States Patent
Harada et al.

(10) Patent No.: US 12,368,026 B2
(45) Date of Patent: Jul. 22, 2025

(54) POLYCRYSTALLINE SiC COMPACT AND METHOD FOR MANUFACTURING THE SAME

(71) Applicant: TOKAI CARBON CO., LTD., Tokyo (JP)

(72) Inventors: Yohei Harada, Tokyo (JP); Junya Oishi, Tokyo (JP)

(73) Assignee: TOKAI CARBON CO., LTD., Minato-ku (JP)

( * ) Notice: Subject to any disclaimer, the term of this patent is extended or adjusted under 35 U.S.C. 154(b) by 0 days.

(21) Appl. No.: 18/269,616

(22) PCT Filed: Sep. 26, 2022

(86) PCT No.: PCT/JP2022/035725
§ 371 (c)(1),
(2) Date: Jun. 26, 2023

(87) PCT Pub. No.: WO2023/074219
PCT Pub. Date: May 4, 2023

(65) Prior Publication Data
US 2024/0055236 A1    Feb. 15, 2024

(30) Foreign Application Priority Data
Oct. 28, 2021    (JP) ................. 2021-176755

(51) Int. Cl.
*H01J 37/32* (2006.01)
*B24B 7/22* (2006.01)
*H01L 21/3065* (2006.01)

(52) U.S. Cl.
CPC .......... *H01J 37/3255* (2013.01); *B24B 7/228* (2013.01); *H01J 2237/334* (2013.01); *H01L 21/3065* (2013.01)

(58) Field of Classification Search
None
See application file for complete search history.

(56) References Cited

U.S. PATENT DOCUMENTS

2021/0143070 A1\* 5/2021 Takei ................. H01L 22/20
2022/0341054 A1\* 10/2022 Ushijima ............. C23C 16/325

FOREIGN PATENT DOCUMENTS

JP    2001-220237 A    8/2001

OTHER PUBLICATIONS

Xu Yang et al., "Novel SiC wafer manufacturing process employing three-step slurryless electrochemical mechanical polishing," Journal of Manufacturing Processes, vol. 70 (2021), available online Sep. 8, 2021, pp. 350-360.
International Search Report in PCT/JP2022/035725, mailed from Japanese Patent Office, Nov. 15, 2022.
Written Opinion in PCT/JP2022/035725, mailed from Japanese Patent Office, Nov. 15, 2022.

\* cited by examiner

*Primary Examiner* — Roberts P Culbert
(74) *Attorney, Agent, or Firm* — Hoffmann & Baron, LLP

(57) ABSTRACT

Provided are a polycrystalline SiC compact capable of achieving uniform plasma etching when used as electrodes and a method for manufacturing the same. A polycrystalline SiC compact has a major surface in which Wa (0 to 10 mm) is 0.00 to 0.05 μm or less, Wa (10 to 20 mm) is 0.13 μm or less, and Wa (20 to 30 mm) is 0.20 μm or less.

7 Claims, No Drawings

POLYCRYSTALLINE SiC COMPACT AND METHOD FOR MANUFACTURING THE SAME

CROSS-REFERENCE TO RELATED APPLICATIONS

This application is a national phase entry under 35 USC § 371 of International Application No. PCT/JP2022/035725, filed Sep. 26, 2022, which claims the benefit of, and priority to Japanese Patent Application No. 2021-176755 filed Oct. 28, 2021, the contents of which are hereby expressly incorporated by reference into the present application in their entireties.

TECHNICAL FIELD

The present invention relates to a polycrystalline SiC compact and a method for manufacturing the same.

BACKGROUND ART

Polycrystalline SiC compacts are excellent in various properties such as heat resistance, corrosion resistance, and strength, and are used in various applications. For example, Patent Literature 1 (Japanese Patent Application Publication No. 2001-220237) describes use of a silicon carbide (SiC) for electrodes for a plasma etching apparatus for use in manufacture of semiconductor devices and the like.

CITATION LIST

Patent Literature

Patent Literature 1: Japanese Patent Application Publication No. 2001-220237

SUMMARY OF INVENTION

Problem to be Solved by the Invention

In semiconductor wafers used in the manufacture of semiconductor devices, the wafer area and the density of circuits formed therein have been increasing. Accordingly, for plasma etching performed in the manufacture of semiconductor devices, there is also a demand for a technique capable of etching semiconductor wafers more uniformly.

Regarding electrodes used for plasma etching, not only the uniformity of electrical resistivity (Patent Literature 1) and the uniformity of thermal conductivity, but also the evenness of the surfaces of the electrodes is considered to affect the uniformity of plasma etching. Therefore, an object of the present invention is to provide a polycrystalline SiC compact capable of achieving uniform plasma etching when used as electrodes and a method for manufacturing the same.

Means for Solution of the Problem

The present inventors have found that the above problem can be solved when an arithmetic mean waviness obtained from each of specific wavelength components in a waviness profile extracted from a primary profile of a major surface of a polycrystalline SiC compact is in a specific range. Specifically, the present invention provides the followings.

An embodiment of the present invention is a polycrystalline SiC compact having two opposed major surfaces, wherein an arithmetic mean waviness Wa for a predetermined wavelength range extracted from a primary profile of each of the major surfaces is set such that the Wa is 005 μm or less when the wavelength range is 0 to 10 mm, is 0.13 μm or less when the wavelength range is 10 to 20 mm, and is 0.20 pun or less when the wavelength range is 20 to 30 mm.

In addition, an embodiment of the present invention is a polycrystalline SiC compact manufacturing method for manufacturing the above poly crystalline SiC compact, comprising the steps of: forming a polycrystalline SiC film having major surfaces; and grinding the major surfaces of the polycrystalline SiC film, wherein the step of grinding includes the steps of: grinding the major surfaces with a first abrasive, grinding the major surfaces with a second abrasive after the step of grinding with the first abrasive; and grinding the major surfaces with a third abrasive after the step of grinding with the second abrasive, a grain size of the first abrasive is coarser than that of the second abrasive, and the grain size of the second abrasive is coarser than that of the third abrasive.

Advantageous Effects of Invention

According to the present invention, provided are a polycrystalline SiC compact capable of achieving uniform plasma etching when used as electrodes and a method for manufacturing the same.

DESCRIPTION OF EMBODIMENTS

Hereinafter, embodiments of the present invention will be described.

(Polycrystalline SiC Compact)

A polycrystalline SiC compact according to the present embodiment has two opposed major surfaces. The two major surfaces include a first major surface and a second major surface. In the specification of the present application, the major surface refers to a substantially flat surface. The arithmetic mean waviness Wa for a specific wavelength range extracted from the primary profile of this major surface is 0.05 pin or less when the wavelength range is 0 to 10 mm, is 0.13 μm or less when the wavelength range is 10 to 20 mm, and is 0.20 μm or less when the wavelength range is 20 to 30 mm.

Here, the definitions of "primary profile" and "arithmetic mean waviness" conform to JIS B 0601. For example, the primary profile is decomposed into frequencies when extracting a wavelength range of 0 to 10 mm from the primary profile, and the arithmetic mean waviness is derived by setting, as a cutoff value, the frequency at which the amplitude transmissibility of the frequency components of $1 \times 10^3$/m or higher is 50%. This frequency decomposition is preferably decomposition by Fourier transform.

The arithmetic mean waviness Wa for the wavelength range of 0 to 10 mm (hereafter referred to as "Wa (0 to 10 mm)") is an arithmetic mean waviness obtained from components with spatial frequencies of 1 ($\times 10^3$/m) or higher in the primary profile.

The arithmetic mean waviness Wa for the wavelength range of 10 to 20 mm (hereafter referred to as "Wa (10 to 20 mm)") is an arithmetic mean waviness obtained from components with spatial frequencies of ½ to 1 ($\times 10^3$/m) in the primary profile.

The arithmetic mean waviness Wa for the wavelength range of 20 to 30 mm (hereafter referred to as "Wa (20 to 30 mm)") is an arithmetic mean waviness obtained from components with spatial frequencies of ⅓ to ½ ($\times 10^3$/m) in the primary profile.

According to the present embodiment, it is possible to achieve uniform plasma etching with little unevenness by using, as electrodes, a polycrystalline SiC compact having the specific Wa (0 to 10 mm), the specific Wa (10 to 20 mm), and the specific Wa (20 to 30 mm) as described above.

In addition, the polycrystalline SiC compact according to the present embodiment has highly flat major surfaces. Therefore, the polycrystalline SiC compact may be suitably used for other applications required to the flatness in addition to electrodes for a plasma etching apparatus. For example, in some cases, the polycrystalline SiC compact according to the present embodiment is bonded to a single-crystal SiC substrate and used as a supporting base member for the single-crystal SiC substrate. In this application, the polycrystalline SiC compact is required to have a flat surface. The poly crystalline SiC compact according to the present embodiment has flat major surfaces. Therefore, the polycrystalline SiC compact may be also suitably used for an application which uses the polycrystalline SiC compact bonded to a single-crystal SiC substrate.

Preferably, the polycrystalline SiC compact is disk-shaped. In other words, the major surfaces of the polycrystalline SiC compact are in a circular shape. More preferably, the polycrystalline SiC compact is a disk-shaped polycrystalline SiC compact and the major surfaces of the polycrystalline SiC compact have a diameter of 1.5 to 20 inches and more preferably 6 to 18 inches.

Preferably, the thickness of the polycrystalline SIC compact is 0.1 to 4.0 mm.

(Poly Crystalline SiC Compact Manufacturing Method)

Next, a polycrystalline SiC compact manufacturing method according to the present embodiment will be described.

The manufacturing method according to the present embodiment includes a process of forming a polycrystalline SiC film having major surfaces (step S1) and a process of grinding the major surfaces of the polycrystalline SiC film (step S2). Hereinafter, each of the processes will be described in detail.

Step S1: Formation of Polycrystalline SiC Film

The polycrystalline SiC film can be formed by using, for example, a CVD method. The film formation conditions are not particularly limited, and known conditions (for example, Japanese Patent Application Publication No. 2021-54666) can be adopted.

For example, first, a graphite substrate is placed as a base substrate in a CVD furnace.

Then, carrier gas, raw material gas as an SiC supply source, and optionally nitrogen-containing gas are mixed and the mixture gas is supplied to the CVD furnace. The temperature of the surface of the base substrate is set such that polycrystalline SiC can be generated from the raw material gas. In this way, a polycrystalline SiC layer is formed on the base substrate. Here, in the case where the nitrogen-containing gas is used, the polycrystalline SiC layer can be doped with nitrogen.

After the polycrystalline SiC layer is formed, the obtained polycrystalline SiC layer is separated from the base substrate. In this way, a polycrystalline SiC film having two major surfaces (a first surface and a second surface) can be obtained.

The polycrystalline SiC film obtained above has a volume resistivity of preferably 0.050 Ωcm or less. When the polycrystalline SiC film having the above volume resistivity is used as electrodes for plasma etching, the volume resistivity of the polycrystalline SIC film can effectively release static electricity and generate plasma gas uniformly. Moreover, the volume resistivity of the polycrystalline SIC film is preferably 0.030 Ωcm or less and more preferably 0.020 Ωcm or less from the viewpoint that a high etching rate can be ensured when the polycrystalline SIC film is used as electrodes for plasma etching.

The volume resistivity can be adjusted, for example, by adding a predetermined amount of nitrogen to the polycrystalline SiC film. The volume resistivity can be decreased by increasing the nitrogen content.

The nitrogen content of the polycrystalline SiC film is, for example, 200 ppm (parts per million by mass) or more and preferably 200 to 1000 ppm (parts per million by mass). When the nitrogen content is within the above range, a degree of change in the resistivity relative to a change in the nitrogen content is small. Therefore, a desired volume resistivity can be obtained easily by controlling the nitrogen content of the polycrystalline SiC film. Moreover, if the nitrogen content is 1000 ppm (parts per million by mass) or less, crystal defects caused by the introduction of nitrogen hardly affect the flatness of the polycrystalline SiC film.

Here, a nitrogen introduction method is not particularly limited. For example, by using nitrogen-containing gas in forming a polycrystalline SiC film in the CVD method as described above, the nitrogen can be introduced into the polycrystalline SiC film thus formed.

Step S2: Grinding

Subsequently, the two major surfaces of the polycrystalline SiC film obtained are ground. Here, the major surfaces are ground in three stages (steps S2-1 to S2-3) described below.

[Step S2-1]

First, the major surfaces of the polycrystalline SIC film are ground with a first abrasive. Specifically, the polycrystalline SiC film is placed on a supporting substrate (for example, a metal flat plate) and fixed to the supporting substrate with a first fixing material. In the above action, the polycrystalline SiC film is fixed to the supporting substrate such that one of the major surfaces is exposed. Then, the exposed major surface of the polycrystalline SIC film is ground with the first abrasive. After the grinding of the one major surface, the polycrystalline SiC film is detached from the supporting substrate. Then, the other major surface is ground in the same manner. The second major surface may be ground after the first major surface is ground. The first major surface may be ground after the second major surface is ground.

Here, the polycrystalline SiC film is fixed on the supporting substrate in the following procedure, for example. First, the supporting substrate and the polycrystalline SiC film are heated on a hot plate to about 100° C. Next, a fixing material (for example, a thermoplastic resin) is placed between the supporting substrate and the polycrystalline SiC film, and the fixing material is softened by the heat conducted from the hot plate to bond the polycrystalline SiC film onto the supporting substrate. After that, the heating of the hot plate is stopped and the fixing material is hardened by cooling the supporting substrate and the polycrystalline SiC film fixed thereon, so that the polycrystalline SiC film is fixed on the supporting substrate.

As the first abrasive, for example, a cup grindstone or abrasive fine powder can be used.

In the case where the first abrasive is, for example, an abrasive fine powder, an abrasive having a relatively coarse grain size (for example, #50 to #500) is used. Here the definition of "grain size" confirms to JIS R 6001-1 and JIS R 6001-2.

As the first fixing material, for example, a thermoplastic resin is used.

As the first fixing material, it is preferable to use a material having a Mooney viscosity of 30 to 60 M.

Here, the Mooney viscosity is expressed in Mooney units (M). The Mooney units refer to units indicated or recorded by a torque indicator device used in a viscosity test and Mooney scorch test in conformity with JIS K 6300-1. Specifically, the Mooney viscosity at which the torque acting on a rotor shaft is 8.30 N·m is 100 Mooney units (100 M).

[Step S2-2]

Next, the polycrystalline SiC film is detached from the supporting substrate, and the first fixing material on the supporting substrate is removed. After that, the polycrystalline SiC film is fixed on the supporting substrate with a second fixing material in the same method as in step S2-1. Subsequently, the major surfaces of the polycrystalline SiC film are ground with a second abrasive.

As the second abrasive, a cup grindstone or abrasive fine powder can be used as is the case with the first abrasive.

Here, the grain size of the second abrasive is finer than the grain size of the first abrasive. For example, in the case of an abrasive fine powder, the grain size of the second abrasive is, for example, more than #500 to #5000 or less.

As the second fixing material, a thermoplastic resin or the like can be used as is the case with the first fixing material.

Here, as the second fixing material, it is preferable to use a material having a Mooney viscosity higher than that of the first fixing material. The Mooney viscosity of the second fixing material is, for example, 60 to 80 M.

[Step S2-3]

Lastly, the polycrystalline SiC film is detached from the supporting substrate and the second fixing material on the supporting substrate is removed as in Step S2-2. After that, the polycrystalline SiC film is fixed on the supporting substrate with a third fixing material in the same method as in step S2-1. Subsequently, the major surfaces of the polycrystalline SiC film are ground with a third abrasive.

As the third abrasive, a cup grindstone or abrasive fine powder can be used as is the case with the first abrasive and the second abrasive.

Here, the grain size of the third abrasive is finer than that of the second abrasive. For example, in the case of an abrasive fine powder, the grain size of the third abrasive is, for example, more than #5000 to #50000 or less.

As the third fixing material, a thermoplastic resin or the like can be used as is the case with the first fixing material and the second fixing material.

Here, the Mooney viscosity of the third fixing material is preferably higher than that of the second fixing material. The Mooney viscosity of the third fixing material is, for example, 80 to 120 M.

According to the present embodiment, the grinding process including steps S2-1 to 2-3 is performed with the abrasive and the fixing material changed as described above. This process flattens both unevenness between positions separated at a certain distance (spatial frequency: low) and unevenness of morphology between adjacent deposited grains (spatial frequency: high) on the major surface of the polycrystalline SiC film. As a result, a poly crystalline SiC compact having the specific Wa (0 to 10 mm), the specific Wa (10 to 20 mm), and the specific Wa (20 to 30 mm) can be obtained.

Examples

Hereinafter, Examples conducted by the present inventors will be described in order to describe the present invention in more details. However, the present invention should not be interpreted by being limited to Examples described below.

(Production of Polycrystalline SiC Film)

In a CVD furnace, a graphite substrate in a disk shape with a diameter of 220 mm and a thickness of 5 mm was placed. A polycrystalline SiC film was formed on the graphite substrate by introducing trimethylchlorosilane as raw material gas, hydrogen as carrier gas, and nitrogen gas into the CVD furnace, and allowing the reaction to proceed for 10 hours with a substrate temperature set at 1500° C.

Here, the concentration of the raw material gas was changed among a film formation initial stage (from the start of film formation to 2.5 hours), a film formation middle stage (from 2.5 hours to 5 hours after the start of film formation)), and a film formation final stage (from 5 hours to 10 hours after the start of film formation). Specifically, the raw material gas concentration in the film formation initial stage (first concentration) was set to 9.0 vol % and the raw material gas concentration in the film formation final stage (second concentration) was set to 7.5 vol %.

In other words, the ratio of the raw material gas concentration in the film formation initial stage to the raw material gas concentration in the film formation final stage (referred to as a raw material gas concentration ratio) was set to 1.2. In the film formation middle stage, the raw material gas concentration was decreased at a constant rate from the concentration in the film formation initial stage to the concentration in the film formation final stage. Here, the flow rate of the raw material gas and the flow rate of the carrier gas were controlled such that their total flow rate was kept constant (140 L/min.).

Also, the flow rate of the nitrogen gas was kept constant throughout the film formation period. Specifically, the flow rate of the nitrogen gas was set to 17.5 (L/min.) The gas residence time was 44.1 (sec). Here, the gas residence time was calculated in accordance with the following formula.

Gas Residence Time (sec)=(Furnace Capacity/Gas Flow Rate)×((20+273)/(Reaction Temperature+ 273))×60  (Formula 1):

After the polycrystalline SiC film was formed, the graphite substrate was taken out from the CVD furnace and subjected to peripheral processing and division processing. Moreover, the graphite substrate was removed to obtain a polycrystalline SiC film in a disk shape with a diameter of 205 mm and a thickness of 0.6 mm.

The two major surfaces of the polycrystalline SiC film thus obtained were ground under conditions specified in Examples 1 to 3 and Comparative Examples 1 to 5 presented below (Table 1), and electrodes for plasma etching were produced.

Here, a thermoplastic resin with a Mooney viscosity of 45 M vas used as the first fixing material, and an abrasive fine powder with an average grain size of #200 was used as the first abrasive. Then, a thermoplastic resin with a Mooney viscosity of 70 M was used as the second fixing material, and an abrasive fine powder with an average grain size of #3000 was used as the second abrasive. Further, a thermoplastic resin with a Mooney viscosity of 100 M was used as the third fixing material, and an abrasive fine powder with an average grain size of #40000 was used as the third abrasive.

As the supporting substrate for fixing the polycrystalline SiC film during grinding, a metal flat plate having a high thermal conductivity was used.

On the other hand, in the case where the first, second, or third fixing material was not used as the fixing material, the polycrystalline SiC film was fixed on a suction table using a porous chuck.

(Wa Measurement Method)

A primary profile of the major surface of the polycrystalline SiC film, the extraction of three wavelength ranges (0 to 10 mm, 10 to 20 mm, and 20 to 30 mm) from the primary profile, and the arithmetic mean waviness for each of the extracted wavelengths (Wa (0 to 10 mm), Wa (10 to 20 mm), and Wa (20 to 30 mm)) were measured and calculated by using FlatMaster manufactured by Coning Tropel.

(Etching Unevenness Evaluation Method)

The poly crystalline SiC film processed in the electrodes for plasma etching was set as electrodes in an etching apparatus, and $CF_4$ plasma was generated with voltage application. A silicon wafer with φ8 inches and a thickness of 0.5 mm was placed as a material to be etched on a sample stage and was etched for one hour with the $CF_4$ plasma described above and then etching unevenness was evaluated by measuring a thickness distribution of the silicon wafer.

In the case of electrodes for plasma etching having poor flatness (in other words, great arithmetic mean waviness), plasma with uniform intensity is not generated, so that the etching rate varies in the material to be etched even if the material is etched for an equal period of time. Accordingly, a smaller difference in the thickness of the silicon wafer indicates that the intensity of generated plasma is more uniform.

Table 2 shows evaluation results of arithmetic mean waviness Wa (0 to 10 mm), Wa (10 to 20 mm), and Wa (20 to 30 mm) and etching unevenness in each Example.

The thickness of the silicon wafer was measured at certain 17 points in an etched surface before and after the plasma etching, and a difference in the etching amount in the etched surface was evaluated. An evaluation index used herein was a value of "the smallest value of the etching amount/the largest value of the etching amount". Each Example was judged as superior to the related art (A) when the above value was 0.98 or more, was judged as comparable to the related art (B) when the above value was 0.95 or more to less than 0.98, and was judged as inferior to the related art (C) when the above value was less than 0.95, (Volume Resistivity Evaluation Method) The volume resistivity of the polycrystalline SiC film was measured with a four-point probe method. The measurement points were set to the center point and other certain 9 points of one of the major surfaces of the polycrystalline SiC film. Here, the volume resistivity of the polycrystalline SiC film was defined as an arithmetic mean of the measured values at the above 10 points and a degree of variation in the volume resistivity was evaluated by using a standard deviation.

(Evaluation Results and Consideration)

In Comparative Example 1, the polycrystalline SIC film was fixed and ground only by using the porous chuck. In this example, the values of the arithmetic mean waviness in all the three wavelength ranges were larger than those in Examples 1 to 3. It is seen that it is impossible to remove the waviness on the face of the major surface in the grinding method with fixation by a porous chuck only. Moreover, the etching using the plasma etching electrodes formed of the polycrystalline SiC film in Comparative Example 1 resulted in larger etching unevenness than in Examples 1 to 3.

In Examples 1 to 3, the values of the arithmetic mean waviness in all the three wavelength ranges were smaller than those in Comparative Examples 1 to 5, and Examples 1 to 3 were good with small etching unevenness. From comparison of Examples 1 to 3 with Comparative Example 5, it is seen that a higher effect of removing waviness at high frequency is produced by increasing the Mooney viscosity along with the progress of the process. This is because the fixing materials with different Mooney viscosities fix the polycrystalline SiC film while elastically deforming by following vibrations of the grinding apparatus and minute deviations in apparatus alignment that occur during grinding, and thereby exert the effect of removing the waviness at a higher level than in the related art.

Here, all the volume resistivities in Examples 1 to 3 and Comparative Examples 1 to 5 were less than 0.010 Ωcm. Then, the standard deviations thereof were less than 0.010.

TABLE 1

| | | Grinding Process S2 | | |
| --- | --- | --- | --- | --- |
| | | S2-1 | S2-2 | S2-3 |
| Ex. 1 | Fixing Material | First Fixing Material | Second Fixing Material | Third Fixing Material |
| | Abrasive | First Abrasive | Second Abrasive | Third Abrasive |
| Ex. 2 | Fixing Material | First Fixing Material | Second Fixing Material | Third Fixing Material |
| | Abrasive | First Abrasive | First Abrasive | Third Abrasive |
| Ex. 3 | Fixing Material | First Fixing Material | Second Fixing Material | Third Fixing Material |
| | Abrasive | First Abrasive | Third Abrasive | Third Abrasive |
| Comp. Ex. 1 | Fixing Material | Porous Chuck | Porous Chuck | Porous Chuck |
| | Abrasive | First Abrasive | Second Abrasive | Third Abrasive |
| Comp. Ex. 2 | Fixing Material | First Fixing Material | Second Fixing Material | Porous Chuck |
| | Abrasive | First Abrasive | Second Abrasive | Third Abrasive |
| Comp. Ex. 3 | Fixing Material | First Fixing Material | Porous Chuck | Third Fixing Material |
| | Abrasive | First Abrasive | Second Abrasive | Third Abrasive |
| Comp. Ex. 4 | Fixing Material | Porous Chuck | Second Fixing Material | Third Fixing Material |
| | Abrasive | First Abrasive | Second Abrasive | Third Abrasive |
| Comp. Ex. 5 | Fixing Material | Third Fixing Material | Second Fixing Material | First Fixing Material |
| | Abrasive | First Abrasive | Second Abrasive | Third Abrasive |

TABLE 2

| | Arithmetic Mean Waviness (μm) | | | Evaluation |
| --- | --- | --- | --- | --- |
| | Wa (0-10 mm) | Wa (10-20 mm) | Wa (20-30 mm) | of Etching Unevenness |
| Ex. 1 | 0.04 | 0.06 | 0.08 | A |
| Ex. 2 | 0.04 | 0.08 | 0.13 | A |
| Ex. 3 | 0.04 | 0.11 | 0.18 | A |
| Comp. Ex. 1 | 0.07 | 0.21 | 0.33 | C |
| Comp. Ex. 2 | 0.06 | 0.10 | 0.14 | C |
| Comp. Ex. 3 | 0.03 | 0.22 | 0.15 | C |

TABLE 2-continued

| | Arithmetic Mean Waviness (μm) | | | Evaluation |
|---|---|---|---|---|
| | Wa (0-10 mm) | Wa (10-20 mm) | Wa (20-30 mm) | of Etching Unevenness |
| Comp. Ex. 4 | 0.04 | 0.07 | 0.28 | C |
| Comp. Ex. 5 | 0.22 | 0.28 | 0.35 | C |

What is claimed is:

1. A polycrystalline SiC compact having two opposed major surfaces, wherein an arithmetic mean waviness Wa for a predetermined wavelength range extracted from a primary profile of each of the major surfaces is such that the Wa is 0.05 μm or less when the wavelength range is 0 to 10 mm, is 0.13 μm or less when the wavelength range is 10 to 20 mm, and is 0.20 μm or less when the wavelength range is 20 to 30 mm.

2. The polycrystalline SiC compact according to claim 1, wherein a volume resistivity is 0.050 Ωcm or less.

3. The polycrystalline SiC compact according to claim 1, which is used as an electrode for a plasma etching apparatus.

4. A polycrystalline SiC compact manufacturing method for manufacturing the polycrystalline SiC compact according to claim 1, comprising the steps of:
   forming a polycrystalline SiC film having major surfaces; and
   grinding the major surfaces of the polycrystalline SiC film, wherein
   the step of grinding includes the steps of:
      grinding the major surfaces with a first abrasive;
      grinding the major surfaces with a second abrasive after the step of grinding with the first abrasive; and
      grinding the major surfaces with a third abrasive after the step of grinding with the second abrasive,
   a grain size of the first abrasive is coarser than a grain size of the second abrasive, and
   the grain size of the second abrasive is coarser than a grain size of the third abrasive.

5. The polycrystalline SiC compact manufacturing method according to claim 4, wherein the step of grinding with the first abrasive includes a step of fixing the polycrystalline SiC film onto a supporting substrate by using a first fixing material,
   the step of grinding with the second abrasive includes a step of fixing the polycrystalline SiC film onto the supporting substrate by using a second fixing material,
   the step of grinding with the third abrasive includes a step of fixing the polycrystalline SiC film onto the supporting substrate by using a third fixing material,
   a Mooney viscosity of the first fixing material is lower than a Mooney viscosity of the second fixing material, and
   the Mooney viscosity of the second fixing material is lower than a Mooney viscosity of the third fixing material.

6. A plasma etching method comprising the steps of:
   manufacturing the polycrystalline SiC compact by using the method according to claim 4, and
   performing plasma etching by using the polycrystalline SiC compact as an electrode.

7. A plasma etching method comprising the steps of:
   manufacturing the polycrystalline SiC compact by using the method according to claim 5,
   and performing plasma etching by using the polycrystalline SiC compact as an electrode.

\* \* \* \* \*